(12) United States Patent
Yun et al.

(10) Patent No.: US 7,619,937 B2
(45) Date of Patent: Nov. 17, 2009

(54) SEMICONDUCTOR MEMORY DEVICE WITH RESET DURING A TEST MODE

(75) Inventors: Tae-Sik Yun, Kyoungki-do (KR); Kee-Teok Park, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 89 days.

(21) Appl. No.: 11/819,819

(22) Filed: Jun. 29, 2007

(65) Prior Publication Data
US 2008/0211551 A1 Sep. 4, 2008

(30) Foreign Application Priority Data
Jan. 3, 2007 (KR) .................... 10-2007-0000415

(51) Int. Cl.
*G11C 29/00* (2006.01)
*G11C 7/00* (2006.01)
(52) U.S. Cl. .................. 365/201; 365/189.05; 365/191; 365/233.13; 327/142
(58) Field of Classification Search .......... 365/201, 365/226, 189.05, 191; 327/142, 143
See application file for complete search history.

(56) References Cited

U.S. PATENT DOCUMENTS

| 5,039,875 | A | | 8/1991 | Chang |
| 5,612,923 | A | * | 3/1997 | Gibson et al. .......... 365/230.05 |
| 5,870,342 | A | * | 2/1999 | Fukuda ...................... 365/201 |
| 6,118,709 | A | * | 9/2000 | Zink et al. ................... 365/191 |
| 6,690,220 | B2 | | 2/2004 | Kuboshima et al. |
| 6,914,461 | B2 | | 7/2005 | Kwon |
| 7,019,417 | B2 | | 3/2006 | Kang |
| 7,251,171 | B2 | * | 7/2007 | Nishimura et al. .......... 365/191 |
| 2004/0071139 | A1 | | 4/2004 | Burnett |
| 2005/0190627 | A1 | | 9/2005 | Nakatake et al. |
| 2007/0069786 | A1 | * | 3/2007 | Chung et al. ................ 327/198 |

FOREIGN PATENT DOCUMENTS

| JP | 10-149679 | 6/1998 |
| JP | 2002-084176 | 3/2002 |
| JP | 2002-84176 | 3/2002 |
| JP | 2002-323938 | 8/2002 |
| KR | 10-0670697 | 1/2007 |

* cited by examiner

*Primary Examiner*—VanThu Nguyen
*Assistant Examiner*—R Lance Reidlinger
(74) *Attorney, Agent, or Firm*—IP & T Law Firm PLC

(57) ABSTRACT

A semiconductor memory device performs a reset operation at a wafer state by using a signal input through an address pin in a test mode. The semiconductor memory device includes a buffer for transferring a reset command in response to a reset-active signal and a test reset signal, a test-reset entry signal generation unit for generating an internal test-reset entry signal in response to the test reset signal, and a rest signal driving unit for driving an active signal of an output signal of the buffer and the internal test-reset entry signal as an internal reset signal for a reset mode entry.

15 Claims, 8 Drawing Sheets

SEMICONDUCTOR MEMORY DEVICE WITH RESET DURING A TEST MODE

CROSS-REFERENCE TO RELATED APPLICATIONS

The present invention claims priority of Korean patent application no. 10-2007-0000415, filed in the Korean Patent Office on Jan. 3, 2007, which is incorporated by reference in its entirety.

BACKGROUND OF THE INVENTION

The present invention relates to a semiconductor memory device; more particularly, to a semiconductor memory device capable of reducing a test time at a wafer level by excluding a method of receiving an internal reset signal through a specific external pin in a test mode.

FIG. 1 is a timing chart illustrating an entry of an initialization sequence reset at a power-on-state prescribed in Intel's DDR3 specification. Referring to FIG. 1, in order to enter a reset mode, a reset signal RESET should be maintained at a low level for at least 200 μs. Also, a clock enable signal CKE is inactivated at a low level within 10 ns before the reset signal is inactivated and this condition is maintained for 500 μs to initialize a DRAM. The clock enable sign CKE is in a stable state within 10 ns before a clock signal CLK and an external command signal CMD are applied to the memory device. At this time, the external command signal CMD is a NOP command or a chip deselect command.

FIG. 2 is a timing chart showing an entry of a reset mode in a power stabilization condition prescribed in Intel's DDR3 specification. Referring to FIG. 2, a reset signal RESET is activated in a high level for at last 100 ns while the power is stabilized. Also, a clock enable signal CKE goes to a low level within 10 ns before the reset signal is inactivated and this condition is maintained for 500 μs to initialize a DRAM. The clock enable signal CKE is in a stable state within 10 ns before a clock signal CLK and an external command signal CMD are applied to the memory device. At this time, the external command signal CMD is a NOP (no-operation) command or a chip deselect command.

On the other hand, a method for converting a reset command RSTB applied from an external circuit to an internal reset signal RESETB_OUT in order to provide the entry of the reset mode which is mentioned above, will be described below.

FIG. 3 is a block diagram illustrating a reset signal supplying unit in a conventional semiconductor memory device. Referring to FIG. 3, a reset signal generating unit includes a buffer 10 for receiving a reset command RSTB and a reset signal driving unit 20 for driving an internal reset signal RESETB_OUT using an output signal from the buffer 10. A block 30 including a clock buffer, an ODT (on-die termination) buffer and termination resistances enters the reset mode in response to the internal reset signal RESETB_OUT. Meanwhile, as to the device test at the wafer level, tests for a plurality of devices are simultaneously performed through single equipment for mass production. That is, the number of tested devices is determined based on the number of input pins of each device to be tested because the number of the input pins in the equipment is restricted. The more the number of devices to be tested one time are, the less the whole test time is.

However, as shown in FIG. 3, the reset command is applied only from the external pins and, as shown in FIGS. 1 and 2, the entry of the reset mode is not executed without the reset command from the external pins. Accordingly, a method for reducing the number of external input pins is required to reduce the test time at the wafer level.

SUMMARY OF THE INVENTION

Embodiments of the present invention are directed to providing a semiconductor memory device for performing a reset operation at a wafer state by using a signal input through an address pin in a test mode.

In accordance with an aspect of the present invention, a semiconductor memory device includes a buffer for transferring a reset command in response to a reset-active signal and a test reset signal, a test-reset entry signal generation unit for generating an internal test-reset entry signal in response to the test reset signal, and a reset signal driving unit for driving an active signal of an output signal of the buffer and the internal test-reset entry signal as an internal reset signal for a reset mode entry.

In accordance with another aspect of the present invention, a method of driving semiconductor memory device includes sensing an input of a test reset signal via address pins at a wafer state, maintaining a state where an internal test-reset entry signal is in a logic low level for at least 200 μs in response to an activation of the test reset signal, and activating an internal reset signal to control a reset mode entry in response to the internal test-reset entry signal.

DESCRIPTION OF SPECIFIC EMBODIMENTS

Hereinafter, a semiconductor memory device in accordance with the present invention will be described in detail referring to the accompanying drawings.

Figure 1:
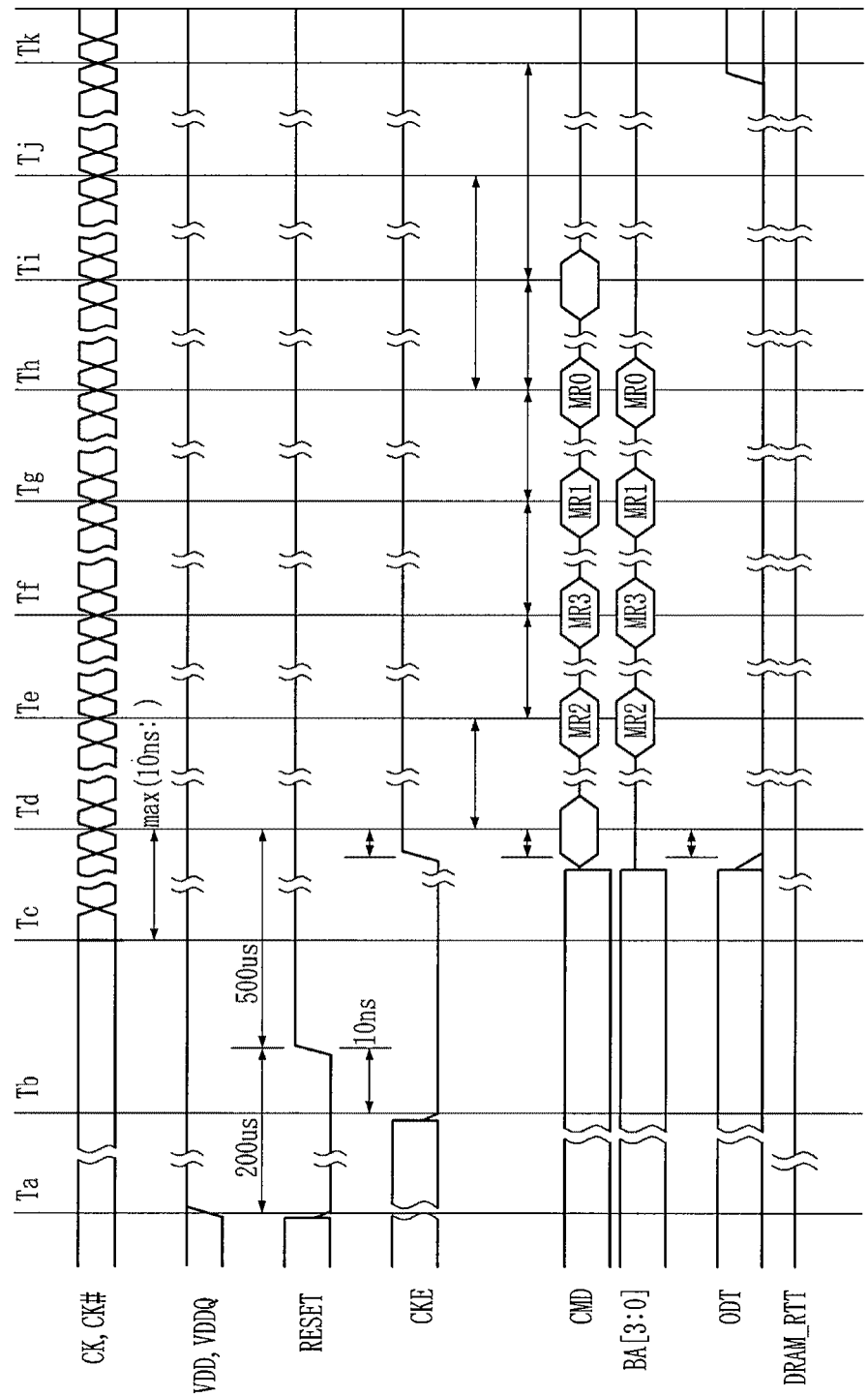
FIG. 1 is a timing chart illustrating an entry of an initialization sequence reset at a power-on-state prescribed in Intel's DDR3 specification.
Figure 2:
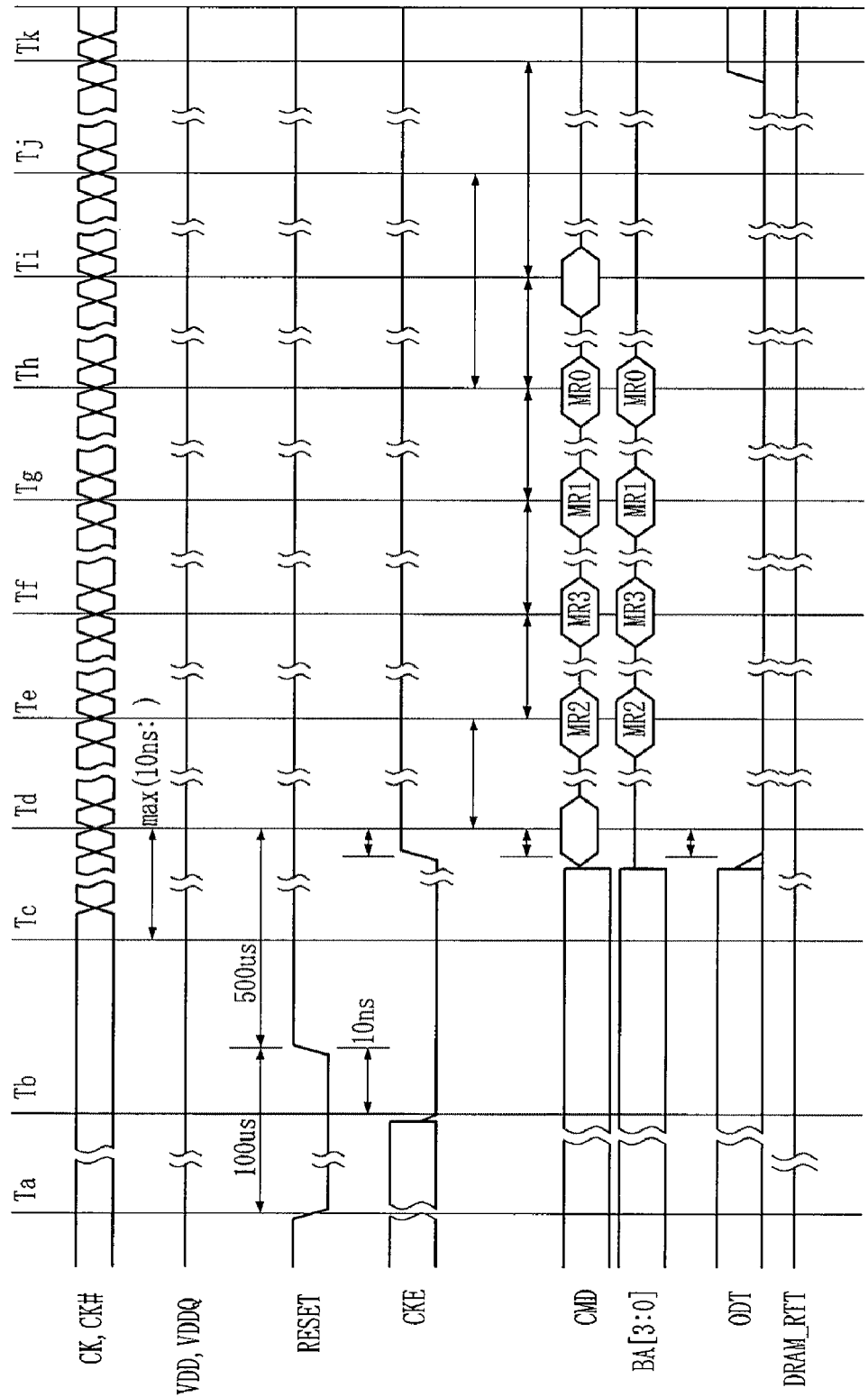
FIG. 2 is a timing chart illustrating an entry of a reset mode in a power stabilization condition prescribed in Intel's DDR3 specification.
Figure 3:
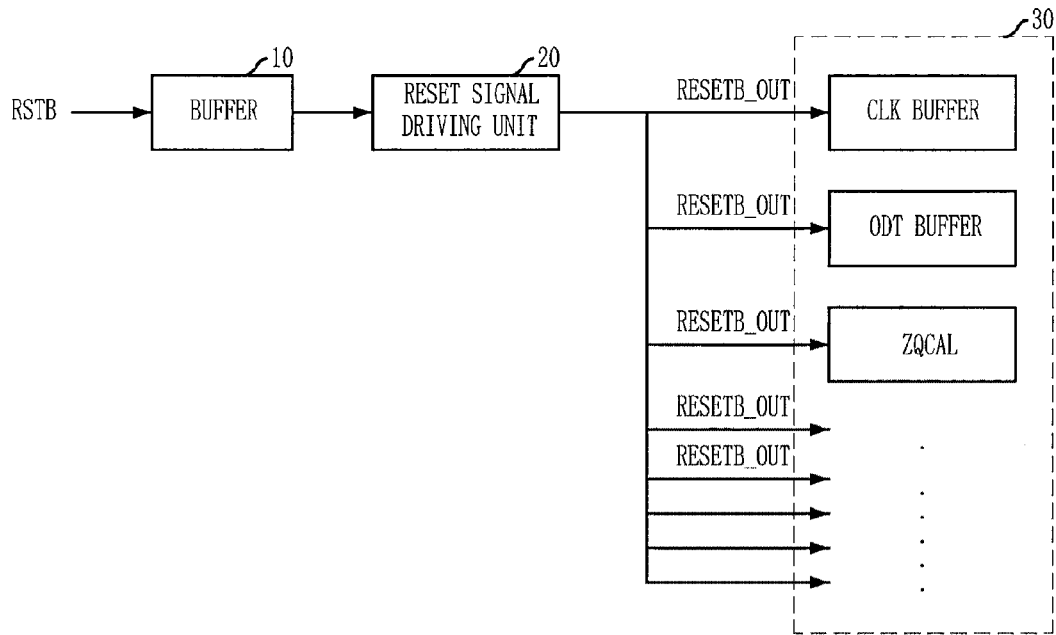
FIG. 3 is a block diagram illustrating a reset signal supplying unit in a conventional semiconductor memory device.
Figure 4:
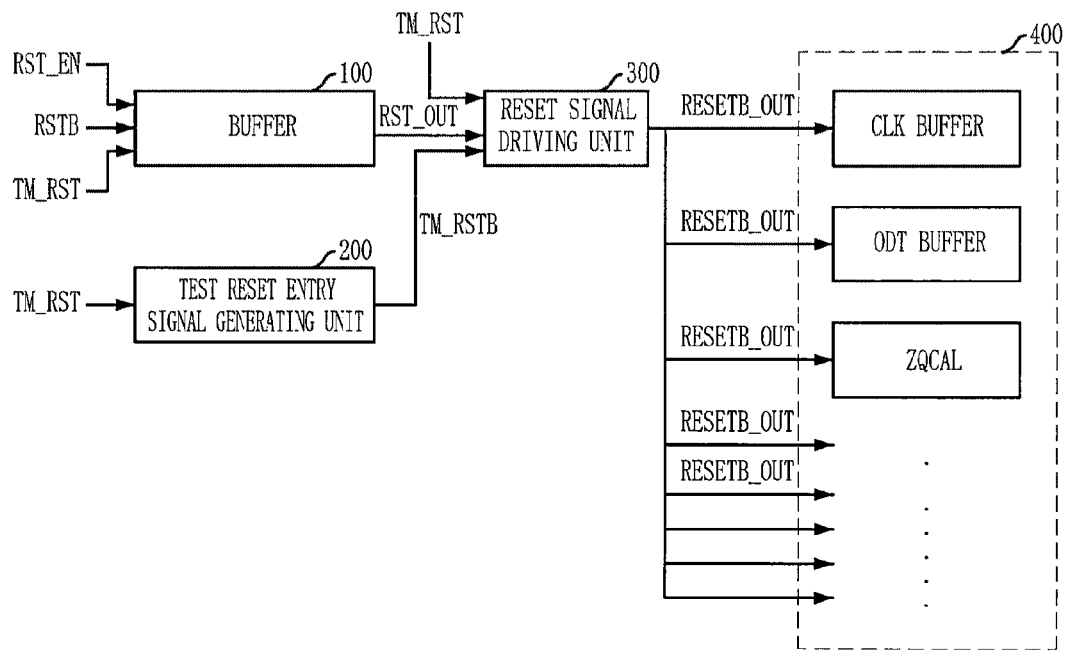
FIG. 4 is a block diagram illustrating a reset signal supplying unit in a semiconductor memory device according to the present invention.

FIG. 4 is a block diagram illustrating a reset signal supplying unit in a semiconductor memory device according to the present invention. Referring to FIG. 4, the reset signal supplying unit according to the present invention includes a buffer 100 for receiving a reset command RSTB in response to a reset-active signal RST_EN and a test reset signal TM_RST, a test reset entry signal generating unit 200 for producing an internal test reset entry signal TM_RSTB by receiving the test reset signal TM_RST, and a reset signal driving unit 300 for driving an internal reset signal RESET-B_OUT by selecting one from an output signal RST_OUT of the buffer 100 and the internal test reset entry signal TM_RSTB in response to the test reset signal TM_RST.

As mentioned above, since the reset signal supplying unit according to the present invention further includes the test reset entry signal generating unit 200, a reset mode entry is executed by internally generating the internal test reset entry signal TM_RSTB without receiving the reset command RSTB through external pins. Accordingly, as compared to the conventional semiconductor memory devices, the semiconductor memory devices according to the present invention has less number of pins to be required for the test, because the external pins are not used for applying the reset command RSTB at the wafer level. The reduction of the pins in number makes the wafer level test time short by simultaneously testing the comparatively large number of memory devices in single equipment.

Figure 5:
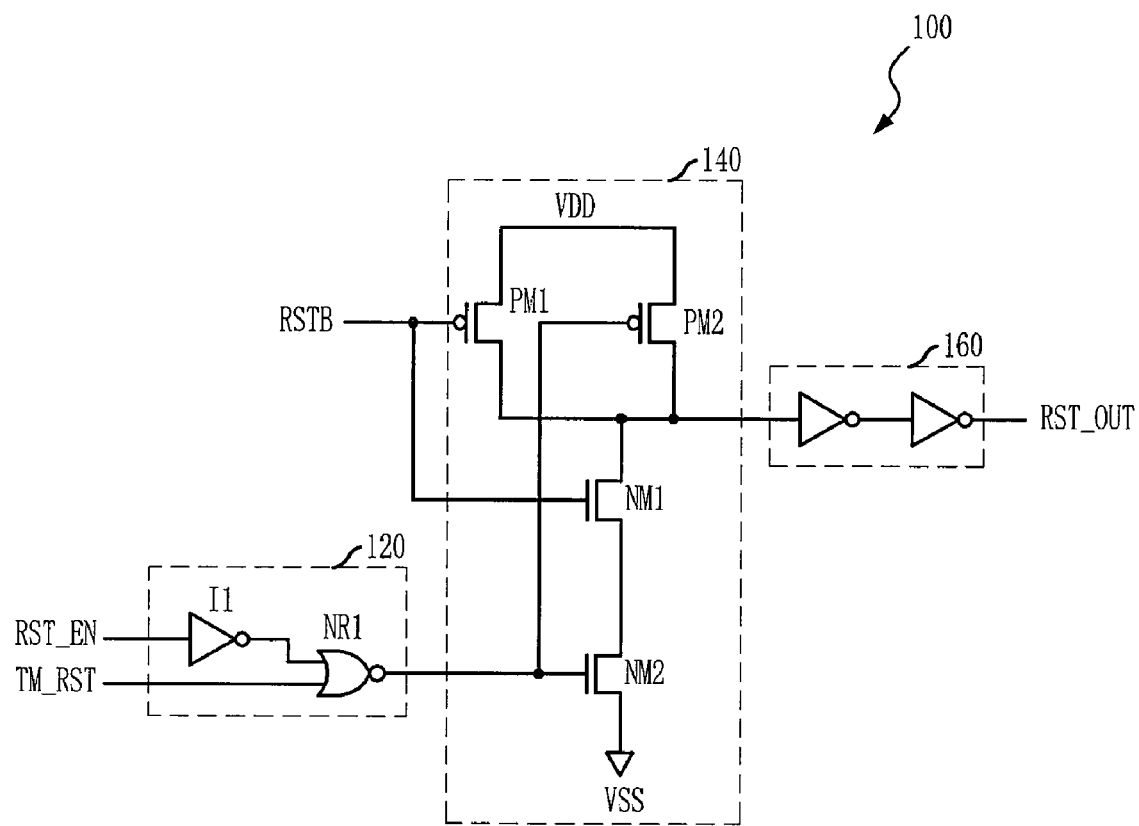
FIG. 5 is a block diagram illustrating a buffer in FIG. 4.

The detailed circuit will be described referring to the accompanying drawings. First, FIG. 5 is a block diagram illustrating an internal circuit in the buffer in FIG. 4. Referring to FIG. 5, the buffer 100 includes an input control unit 120 for producing an input control signal using the reset-active signal RST_EN and the test reset signal TM_RST, a signal input unit 140 for receiving the reset command RSTB in response to the input control signal, and a delay unit 160 for delaying an output signal of the signal input unit 140. The input control unit 120 includes an inverter I1 for inverting the reset-active signal RST_EN and a NOR gate NR1 for receiving an output signal of the inverter I1 and the test reset signal TM_RST and outputting the input control signal.

The signal input unit 140 includes a PMOS transistor PM1 having a gate to receive the reset command RSTB and a source-drain path between a power supply voltage VDD and an output terminal thereof, a PMOS transistor PM2 having a gate to receive the input control signal and a source-drain path between the power supply voltage VDD and the output terminal thereof, an NMOS transistor NM1 having a gate to receive the reset command RSTB and a drain connected to the output terminal thereof, and an NMOS transistor NM2 having a gate to receive the input control signal and a drain-source path between a source of the NMOS transistor NM1 and a ground voltage VSS.

Figure 6:
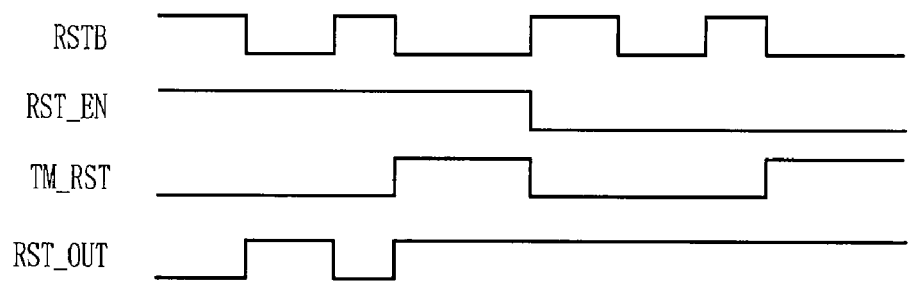
FIG. 6 is a timing chart illustrating an operation of the buffer in FIG. 5.

The delay unit 160 includes an inverter chain for delaying the output signal of the signal input unit 140. FIG. 6 is a timing chart illustrating an operation of the buffer in FIG. 5. Referring to FIG. 6, the input control unit 120 makes the input control signal activated in a high level when the reset-active signal RST_EN is activated in a high level and the test reset signal TM_RST is inactivated in a low level. Further, the signal input unit 140 inverts the reset command RSTB and the delay unit 160 delays the inverted reset command. Since the input control unit 120 makes the input signal inactivated in a low level so that the signal input unit 140 is inactivated when the test reset signal TM_RST is activated in a high level, an output signal of the delay unit 160 is activated in a high level. Also, in the case where the reset-active signal RST_EN is inactivated in a low level, the reset command is not applied to the reset signal supplying unit because the signal input unit 140 is inactivated and the delay unit 160 outputs an output signal in a high level.

Figure 7:
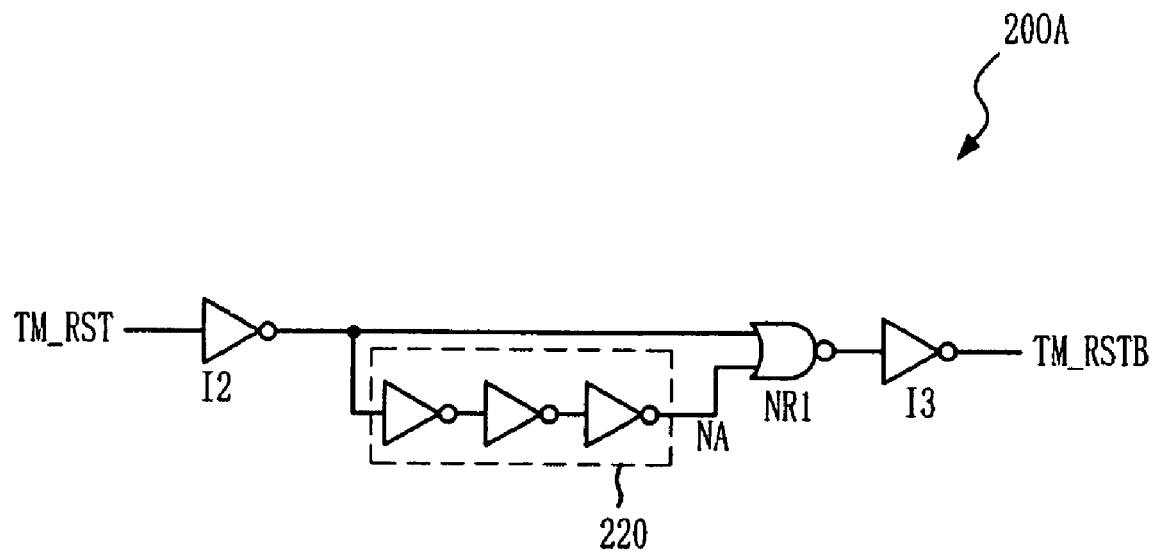
FIG. 7 is a block diagram illustrating a test reset entry signal generating unit of FIG. 4 according to a first embodiment of the present invention.

FIG. 7 is a block diagram illustrating a test reset entry signal generating unit 200A of FIG. 4 according to a first embodiment of the present invention. The test reset entry signal generating unit 200A includes an inverter I2 for inverting the test reset signal TM_RST, an invert-delay unit 220 for inverting and delaying an output signal of the inverter I2, a NOR gate NR1 for NORing an output signal NA of the invert-delay unit 220 and the output signal of the inverter I2, and an inverter I3 for inverting an output signal of the NOR gate NR1 in order to output the internal test reset entry signal TM_RSTB. For example, the invert-delay unit 220 can have a delay time of 200 μs.

Figure 8:
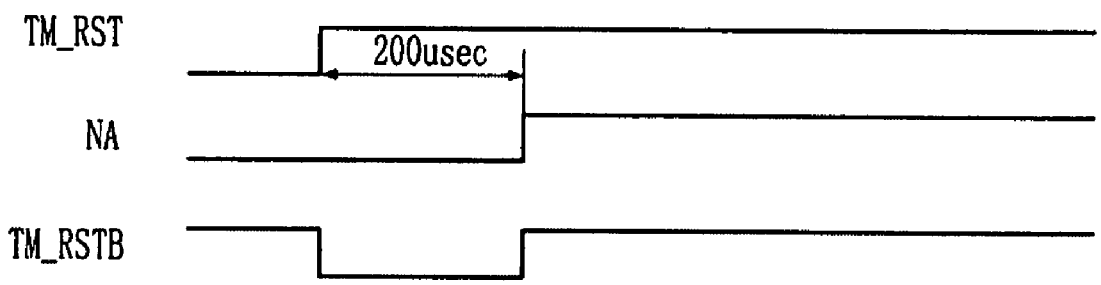
FIG. 8 is a timing chart illustrating an operation of the test reset entry signal generating unit of FIG. 7.

FIG. 8 is a timing chart illustrating an operation of the test reset entry signal generating unit 200A of FIG. 7. Referring to FIG. 8, when the test reset signal TM_RST is activated in a high level, this is inverted by the inverter I2 and the inverted signal is delayed by the invert-delay unit 220 for 200 μs. Next, the NOR gate NR1 and the inverter I3 receive the output signal of the inverter I2 and the output signal NA of the invert-delay unit 220 so that the internal test reset entry signal TM_RSTB, which is activated in a low level for 200 μs after the activation of the internal test reset entry signal TM_RSTB, is produced. That is, according to the first embodiment of the present invention, the test reset entry signal generating unit 200A produces the internal test reset entry signal TM_RSTB which is activated in a low level for 200 μs after the activation of the internal test reset entry signal TM_RSTB.

Figure 9:
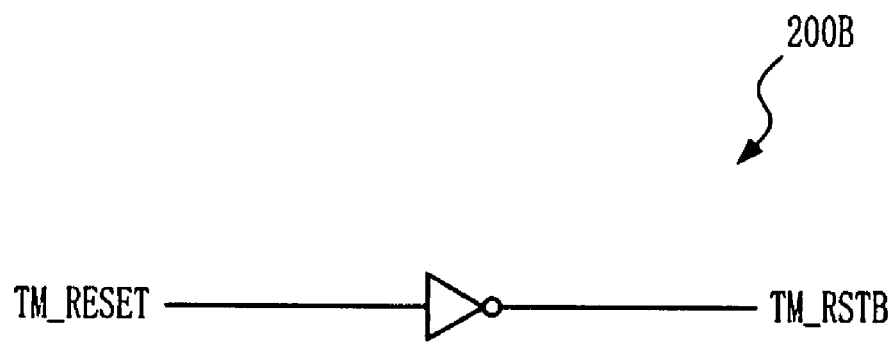
FIG. 9 is a block diagram illustrating a test reset entry signal generating unit according to a second embodiment of the present invention.

FIG. 9 is a block diagram illustrating a test reset entry signal generating unit 200B according to a second embodiment of the present invention. Referring to FIG. 9, the test reset entry signal generating unit 200B includes an inverter for inverting and delaying the test reset signal TM_RST in order to output the internal test reset entry signal TM_RSTB.

Figure 10:
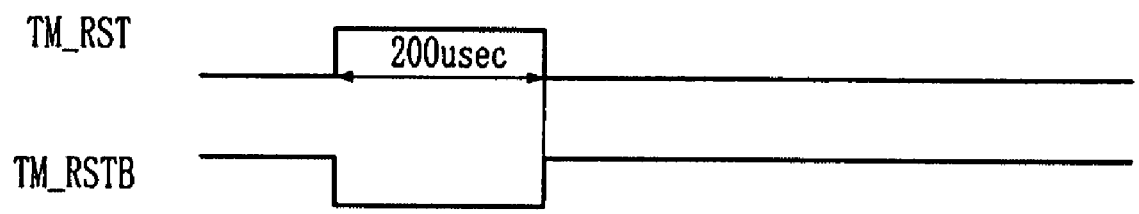
FIG. 10 is a timing chart illustrating an operation of the test reset entry signal generating unit of FIG. 9.

FIG. 10 is a timing chart illustrating an operation of the test reset entry signal generating unit of FIG. 9. As shown in FIG. 10, the test reset entry signal generating unit 200B inverts the test reset signal TM_RST which is activated in a high level for 200 μs and then produces the internal test reset entry signal TM_RSTB which is activated in a low level for 200 μs.

Figure 11:
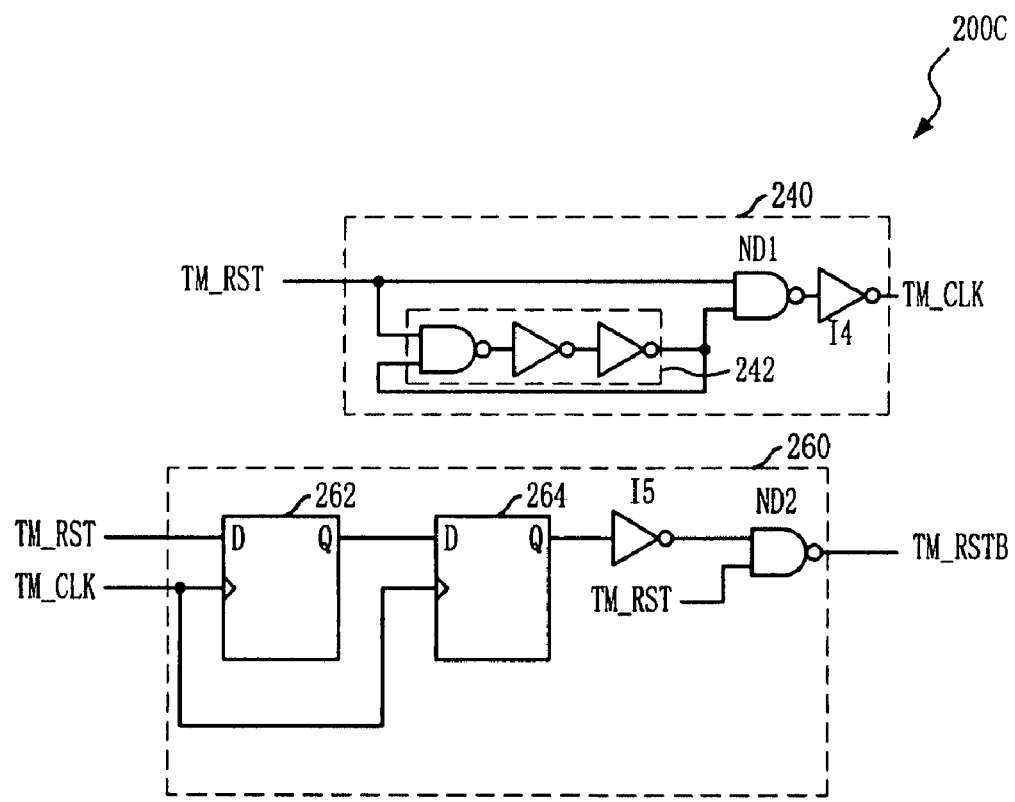
FIG. 11 is a block diagram illustrating a test reset entry signal generating unit according to a third embodiment of the present invention.

FIG. 11 is a block diagram illustrating a test reset entry signal generating unit 200C according to a third embodiment of the present invention. Referring to FIG. 11, the test reset entry signal generating unit 200C includes a pulse clock generating unit 240 for producing a pulse clock signal TM_CLK in response to the test reset signal TM_RST and a signal generating unit 260 for activating the internal test reset entry signal TM_RSTB in response to the activation of the test reset signal TM_RST and for maintaining the activation of the internal test reset entry signal TM_RSTB for two clock signals on a basis of the pulse clock signals TM_CLK.

The pulse clock generating unit 240 includes a pulse generating unit 242 for outputting a pulse train in response to the test reset signal TM_RST, a NAND gate ND1 for NANDing the test reset signal TM_RST and an output signal of the pulse generating unit 242, and an inverter I4 for inverting an output signal of the NAND gate ND1 and then outputting the pulse clock signal TM_CLK. The signal generating unit 260 includes a first D flip-flop 262 for receiving the test reset signal TM_RST in response to an rising edge of the pulse clock signal TM_CLK, a second D flip-flop 264 for receiving an output signal of the first D flip-flop 262 in response to the rising edge of the pulse clock signal TM_CLK, an inverter I5 for inverting an output signal of the second D flip-flop 264, and a NAND gate ND2 for outputting the internal test reset entry signal TM_RSTB by NANDing the test reset signal TM_RST and an output signal of the inverter I5. Further, output signals of the first and second D flip-flops 262 and 264 are initialized to a low level.

Figure 12:
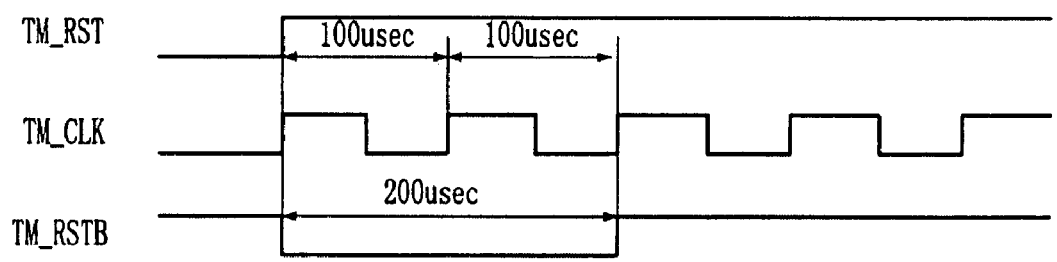
FIG. 12 is a timing chart illustrating an operation of the test reset entry signal generating unit of FIG. 11.

FIG. 12 is a timing chart illustrating an operation of the test reset entry signal generating unit of FIG. 9. As shown in FIG. 10, the pulse clock generating unit 240 outputs the pulse clock signal TM_CLK in a type of the pulse train while the test reset signal TM_RST is in a low level. Since an amount of the delay time of the pulse generating unit 242 is 50 µs, the period of time is 100 µs in the pulse clock signal TM_CLK. Subsequently, the signal generating unit 260 activates the internal test reset entry signal TM_RSTB in a low level in response to the test reset signal TM_RST of the pulse clock signal TM_CLK. Since the first and second D flip-flops 262 and 264 respectively receives a logic high level signal of the test reset signal TM_RST in synchronization with the rising edge of the pulse clock signal TM_CLK, the internal test reset entry signal TM_RSTB transits to a high level after two clock signals based on the pulse clock signal TM_CLK. That is, an active section in which the internal test reset entry signal TM_RSTB is in a low level is maintained for 200 µs after the activation of the test reset signal TM_RST. As mentioned above, the test reset entry signal generating units 200A, 200B and 200C according to the first to third embodiments generates the test reset signal TM_RST, which is activated in a low level for 200 µs, in response to the activation of the test reset signal TM_RST. It should be noted that the internal test reset entry signal TM_RSTB and the test reset signal TM_RST are a combination of address signals <0:7> at the wafer test level.

Figure 13:
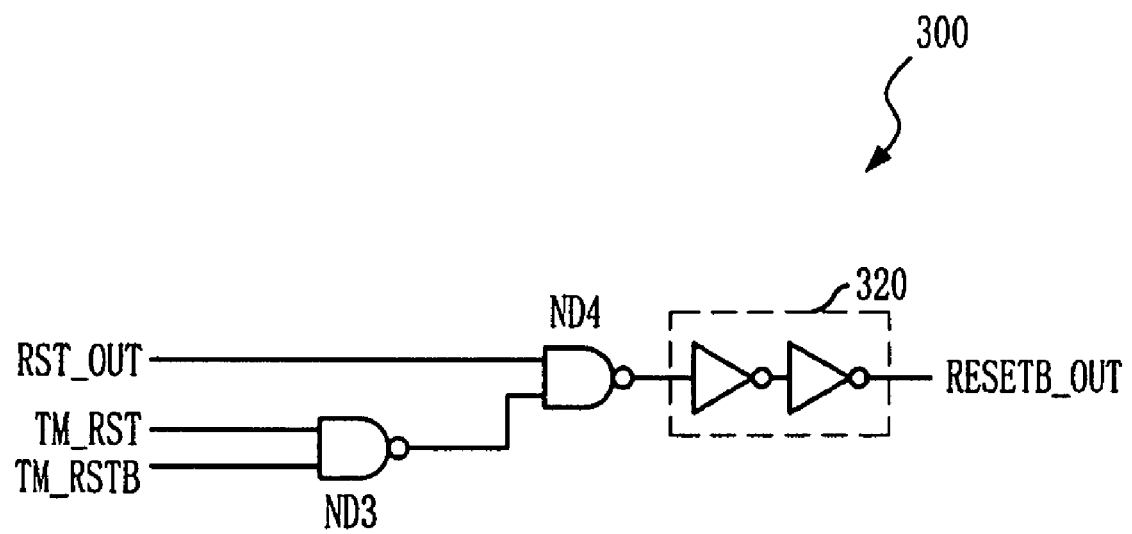
FIG. 13 is a block diagram illustrating a reset driving unit of FIG. 4.

FIG. 13 is a block diagram illustrating the reset driving unit 300 of FIG. 4. Referring to FIG. 13, the reset driving unit 300 includes a NAND gate ND3 receiving the test reset signal TM_RST and the internal test reset entry signal TM_RSTB, a NAND gate ND4 receiving an output signal of the NAND gate ND3 and the output signal RST_OUT of the buffer 100, and a delay unit 320 outputting an internal reset signal RESETB_OUT by delaying an output signal of the NAND gate ND4. In the reset driving unit 300, if the internal test reset entry signal TM_RSTB is activated while the test reset signal TM_RST is activated, the internal reset signal RESETB_OUT is activated base on the activation of the internal test reset entry signal TM_RSTB. Further, when the test reset signal TM_RST is inactivated, the internal reset signal RESETB_OUT is outputted in response to the output signal of the buffer 100. That is, the internal reset signal RESETB_OUT is outputted in response to the internal test reset entry signal TM_RSTB during the test in which the test reset signal TM_RST is applied and the output signal of the buffer 100, which is applied to specific external pins for the command, is outputted as the internal reset signal RESETB_OUT.

As mentioned above, the present invention produces the internal reset signal at the wafer level test of DDR3 DRAM without using the external pins, by employing the signals applied from the address pins. Accordingly, it is possible to reduce the number of external pins required at the wafer test so that a large number of semiconductor memory devices can be simultaneously inspected in the test equipment, as compared to the conventional test method, and the total time of the test can be further reduced. Moreover, it is possible to execute the above-mentioned reset mode with other test modes.

As apparent from the above, the present invention internally generates the reset command without using the external pins, thereby reducing the test time at the parallel test with the reduced number of pins.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a buffer for transferring a reset command in response to a reset-active signal and a test reset signal;
   a test-reset entry signal generation unit for generating an internal test-reset entry signal in response to the test reset signal; and
   a reset signal driving unit for selectively driving an active signal of an output signal of the buffer and the internal test-reset entry signal, as an internal reset signal for a reset mode entry, in response to the test reset signal.

2. The semiconductor memory device of claim 1, further comprising address pins to receive the test reset signal and the reset active signal.

3. The semiconductor memory device of claim 2, wherein the buffer includes:
   an input control unit for producing an input control signal using the reset-active signal and the test reset signal;
   a signal input unit for transferring the reset command in response to the input control signal; and
   a delay unit for delaying an output signal of the signal input unit.

4. The semiconductor memory device of claim 3, wherein the input control unit includes:
   a first inverter for inverting the reset-active signal; and
   a logic gate for performing a NOR operation on an output signal of the inverter and the test reset signal, thereby outputting the input control signal.

5. The semiconductor memory device of claim 4, wherein the signal input unit includes:
   a first PMOS transistor for having a gate to receive the reset command and a source-drain path between a power supply voltage and an output terminal of the signal input unit;
   a second PMOS transistor for having a gate to receive the input control signal and a source-drain path between the power supply voltage and the output terminal of the signal input unit;
   a first NMOS transistor for having a gate to receive the reset command and a drain connected to the output terminal of the signal input unit; and
   a second NMOS transistor for having a gate to receive the input control signal and a drain-source path between a source of the first NMOS transistor and a ground voltage.

6. The semiconductor memory device of claim 2, wherein the reset signal driving unit includes:
   a first logic gate for performing a NAND operation on the test reset signal and the internal test-reset entry signal;
   a second logic gate for performing a NAND operation on an output signal of the first logic gate and the output signal of the buffer; and
   a delay unit for outputting the internal reset signal by delaying the output signal of the second logic gate.

7. The semiconductor memory device of claim 2, wherein the internal test-reset entry signal is a pulse signal having an active section for at least 200 µs.

8. The semiconductor memory device of claim 7, wherein the test-reset entry signal generation unit includes:
   a first inverter for inverting the test reset signal;
   an invert-delay unit for inverting and delaying an output signal of the first inverter;

a first logic gate for performing a NOR operation on an output signal of the invert-delay unit and the output signal of the first inverter; and a second inverter for inverting an output signal of the first logic gate in order to output the internal-test-reset entry signal.

9. The semiconductor memory device of claim 8, wherein the invert-delay unit has a delay time of 200 μs.

10. The semiconductor memory device of claim 7, wherein the test-reset entry signal generation unit includes an inverter to output the internal test-reset entry signal by inverting and delaying the test reset signal.

11. The semiconductor memory device of claim 7, wherein the test-reset entry signal generation unit includes:

a pulse clock generating unit for producing a pulse clock signal in response to the test reset signal; and a signal generating unit for activating the internal test-reset entry signal in response to the activation of the test reset signal and for maintaining an activation of the internal test-reset entry signal for two clock signals on a basis of the pulse clock signals.

12. The semiconductor memory device of claim 11, wherein the pulse clock generating unit includes:

a pulse generating unit for outputting a pulse train in response to the test reset signal;

a first logic gate for performing a NAND operation on the test reset signal and an output signal of the pulse generating unit; and a first inverter for inverting an output signal of the first logic gate, thereby outputting the pulse clock signal.

13. The semiconductor memory device of claim 12, wherein the pulse clock signal has a time period of 100 μs.

14. The semiconductor memory device of claim 13, wherein the signal generating unit includes:

a first D flip-flop for receiving the test reset signal in response to a rising edge of the pulse clock signal;

a second D flip-flop for receiving an output signal of the first D flip-flop in response to the rising edge of the pulse clock signal;

a second inverter for inverting an output signal of the second D flip-flop; and a second logic gate for outputting the internal test-reset entry signal by performing a NAND operation on the test reset signal and an output signal of the second inverter.

15. A method for driving a semiconductor memory device comprising:

sensing, at a wafer state, an input of a test reset signal via address pins during a test mode;

maintaining a state where an internal test-reset entry signal is in a logic low level for at least 200 μs in response to an activation of the test reset signal; and selectively activating an internal reset signal to control a reset mode entry in response to the internal test-reset entry signal or a reset command according to the test reset signal.

* * * * *